(12) United States Patent
Moreta et al.

(10) Patent No.: US 10,887,947 B2
(45) Date of Patent: Jan. 5, 2021

(54) TRANSISTOR IMPLEMENTED HEAT SOURCE

(71) Applicants: Adison Moreta, Santo Domingo (DO); Leandro Veloz, Santo Domingo (DO); Junior Darian-Vargas, Santo Domingo (DO)

(72) Inventors: Adison Moreta, Santo Domingo (DO); Leandro Veloz, Santo Domingo (DO); Junior Darian-Vargas, Santo Domingo (DO)

( * ) Notice: Subject to any disclaimer, the term of this patent is extended or adjusted under 35 U.S.C. 154(b) by 0 days.

(21) Appl. No.: 15/553,983

(22) PCT Filed: Mar. 4, 2017

(86) PCT No.: PCT/IB2017/051273
§ 371 (c)(1),
(2) Date: Aug. 26, 2017

(87) PCT Pub. No.: WO2017/153881
PCT Pub. Date: Sep. 14, 2017

(65) Prior Publication Data
US 2018/0368212 A1    Dec. 20, 2018

Related U.S. Application Data

(60) Provisional application No. 62/305,172, filed on Mar. 8, 2016.

(51) Int. Cl.
*H05B 1/02* (2006.01)
*H05B 3/00* (2006.01)
*H05B 3/02* (2006.01)
*H01L 23/34* (2006.01)
*G01K 13/00* (2006.01)

(52) U.S. Cl.
CPC ............. *H05B 3/00* (2013.01); *G01K 13/00* (2013.01); *H01L 23/34* (2013.01); *H01L 23/345* (2013.01); *H05B 1/0227* (2013.01); *H05B 3/0014* (2013.01); *H05B 3/0019* (2013.01)

(58) Field of Classification Search
None
See application file for complete search history.

(56) References Cited

U.S. PATENT DOCUMENTS

| | | | | |
|---|---|---|---|---|
| 4,041,276 A | * | 8/1977 | Schwarz | A61C 19/00 392/484 |
| 4,266,556 A | * | 5/1981 | Barlow | A61B 5/1491 219/209 |
| 4,935,600 A | * | 6/1990 | Pachschwoll | B23K 3/033 219/240 |
| 5,105,067 A | * | 4/1992 | Brekkestran | G05D 23/2401 2/69 |

(Continued)

*Primary Examiner* — Joseph M. Pelham
(74) *Attorney, Agent, or Firm* — Luis Figarella

(57) ABSTRACT

A heat source comprised of one or more transistors or transistor packages mechanically connected to a heat plate. The heat generation is accomplished by the direct and precisely controlled heat generated by one or more transistors through the precise duty cycle control of a high-frequency Pulse-Width-Modulated (PWM) which is generated based on the sensed temperature and current generated by one or more of the transistor(s).

8 Claims, 3 Drawing Sheets

(56) References Cited

U.S. PATENT DOCUMENTS

| | | | | |
|---|---|---|---|---|
| 5,690,849 A | * | 11/1997 | DeVilbiss | G05D 23/1913 |
| | | | | 219/209 |
| 6,188,556 B1 | * | 2/2001 | Souri | H03K 17/0826 |
| | | | | 361/106 |
| 7,586,064 B1 | * | 9/2009 | Smith | H05B 1/0233 |
| | | | | 219/497 |
| 7,952,599 B2 | * | 5/2011 | Zhou | B41M 7/009 |
| | | | | 347/129 |
| 9,012,810 B2 | * | 4/2015 | Santoruvo | B01J 19/0093 |
| | | | | 219/209 |
| 9,433,943 B2 | * | 9/2016 | Bashir | H05B 6/802 |
| 9,791,173 B2 | * | 10/2017 | Chen | F24H 9/2071 |
| 2003/0155349 A1 | * | 8/2003 | Matsuo | H05B 6/06 |
| | | | | 219/664 |
| 2014/0251978 A1 | * | 9/2014 | Bleil | F02P 19/025 |
| | | | | 219/497 |
| 2015/0122899 A1 | * | 5/2015 | Kaneko | H05B 1/0236 |
| | | | | 236/94 |
| 2017/0059209 A1 | * | 3/2017 | Chen | F24H 3/002 |

* cited by examiner

TRANSISTOR IMPLEMENTED HEAT SOURCE

CROSS-REFERENCE TO RELATED APPLICATIONS

This application claims priority to U.S. Provisional patent application Ser. No. 62/305,172 titled "Transistor Implemented Heat Source", filed on Mar. 8, 2016 the disclosure of which is herein incorporated by reference in its entirety.

PATENTS CITED

The following documents and references are incorporated by reference in their entirety, Rich (U.S. Pat. No. 3,002,802), Del Duca (U.S. Pat. No. 3,330,941), Schwarz et al (U.S. Pat. No. 4,041,276), Dietz et all (U.S. Pat. No. 5,517,053), Eppes et al (U.S. Pat. No. 6,878,172), Zhou et al (U.S. Pat. No. 7,952,599), Goldin et al (U.S. Pat. No. 8,548,312), Santuorvo et al (U.S. Pat. No. 9,012,810), Bashir et al ((U.S. Pat. No. 9,433,943) and REC Johnson et al, EDN Network Use a transistor as a heater, April 2012.

FIELD OF THE INVENTION

The present invention relates to a system and method for generating heat in an efficient fashion, and particularly to the use of transistors as a primary heat source.

DESCRIPTION OF THE RELATED ART

Since their invention, transistors have been used by engineers interested in controlling a current over a load. With time, once flimsy and delicate components have matured into reliable and robust current drivers capable of amplifying signals and providing designers with myriad other control options.

In fact, in many cases, cooling the transistor has resulted in transistor packages with significant heat dissipation packages, the controller has become a contributor to the heat equation.

What is needed, is to use the transistor package not just as a controller for a heater, but as the actual heating unit itself.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

In one aspect the invention is about a heat generating apparatus comprising an electronic circuit comprised of an electronic calculating component, a circuit driver component, a temperature measurement component, a current measurement component and one or more transistors and wherein said electronic calculating component is capable of interfacing with said temperature measurement and said current measurement components to generate a transistor control signal through said circuit driver component. In another aspect, said temperature measuring component is comprised of two or more resistors, said current measurement component is comprised of a hall effect sensor, said circuit driver component is comprised of an IC driver and one or more resistors, said electronic calculating component is comprised of one of; CPU, FPGA and/or ASIC, and said transistor control signal is comprised of a Pulse-Width-Modulation (PWM) signal. In yet another aspect, said circuit driver component IC has a bandwidth over 10 KHz. In another aspect, said one or more transistors are mechanically coupled to a heat transmitting component.

In another aspect, the invention is about a method for generating heat without external resistors, said method comprising the steps of providing an electronic circuit comprised of an electronic calculating component, a circuit driver, a temperature measurement component, a current measurement component and one or more transistors and wherein said electronic calculating component is capable of interfacing with said temperature measurement and said current measurement components to generate a transistor control signal through said circuit driver. In another aspect, said temperature measuring component is comprised of two or more resistors, said current measurement component is comprised of a hall effect sensor, said circuit driver component is comprised of an IC driver and one or more resistors, said electronic calculating component is comprised of one of; CPU, FPGA and/or ASIC, and said transistor control signal is comprised of a Pulse-Width-Modulation (PWM) signal. In yet another aspect, said circuit driver component IC has a bandwidth over 10 KHz. In another aspect, said one or more transistors are mechanically coupled to a heat transmitting component.

Other features and advantages of the present invention will become apparent upon examining the following detailed description of an embodiment thereof, taken in conjunction with the attached drawings.

Figure 1:
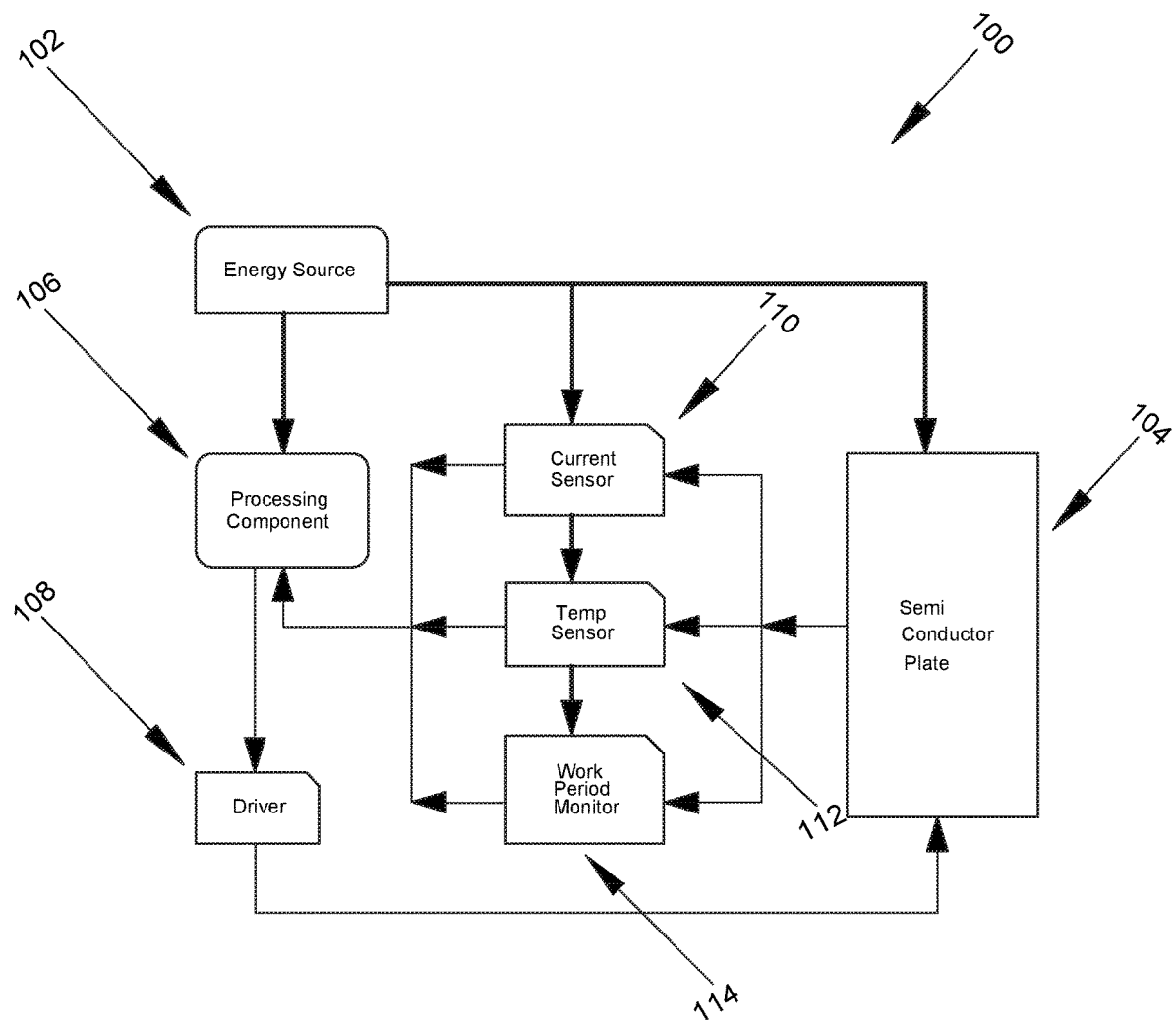
FIG. 1 shows an illustration of a proposed system block diagram, according to an exemplary embodiment of the invention.

The above-described and other features will be appreciated and understood by those skilled in the art from the following detailed description, drawings, and appended claims.

DETAILED DESCRIPTION OF THE PREFERRED EMBODIMENT

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

To provide an overall understanding of the invention, certain illustrative embodiments and examples will now be described. However, it will be understood by one of ordinary skill in the art that the same or equivalent functions and sequences may be accomplished by different embodiments that are also intended to be encompassed within the spirit and scope of the disclosure. The compositions, apparatuses, systems and/or methods described herein may be adapted and modified as is appropriate for the application being addressed and that those described herein may be employed in other suitable applications, and that such other additions and modifications will not depart from the scope hereof.

Simplifications or omissions may be made to avoid obscuring the purpose of the section. Such simplifications or omissions are not intended to limit the scope of the present invention. All references, including any patents or patent applications cited in this specification are hereby incorporated by reference. No admission is made that any reference constitutes prior art. The discussion of the references states what their authors assert, and the applicants reserve the right to challenge the accuracy and pertinence of the cited documents. It will be clearly understood that, although a number of prior art publications are referred to herein, this reference does not constitute an admission that any of these documents form part of the common general knowledge in the art.

As used in the specification and claims, the singular forms "a", "an" and "the" include plural references unless the context clearly dictates otherwise. For example, the term "a transaction" may include a plurality of transaction unless the context clearly dictates otherwise. As used in the specification and claims, singular names or types referenced include variations within the family of said name unless the context clearly dictates otherwise.

Certain terminology is used in the following description for convenience only and is not limiting. The words "lower," "upper," "bottom," "top," "front," "back," "left," "right" and "sides" designate directions in the drawings to which reference is made, but are not limiting with respect to the orientation in which the modules or any assembly of them may be used.

It is acknowledged that the term 'comprise' may, under varying jurisdictions, be attributed with either an exclusive or an inclusive meaning. For the purpose of this specification, and unless otherwise noted, the term 'comprise' shall have an inclusive meaning—i.e. that it will be taken to mean an inclusion of not only the listed components it directly references, but also other non-specified components or elements. This rationale will also be used when the term 'comprised' or 'comprising' is used in relation to one or more steps in a method or process.

Figure 2:
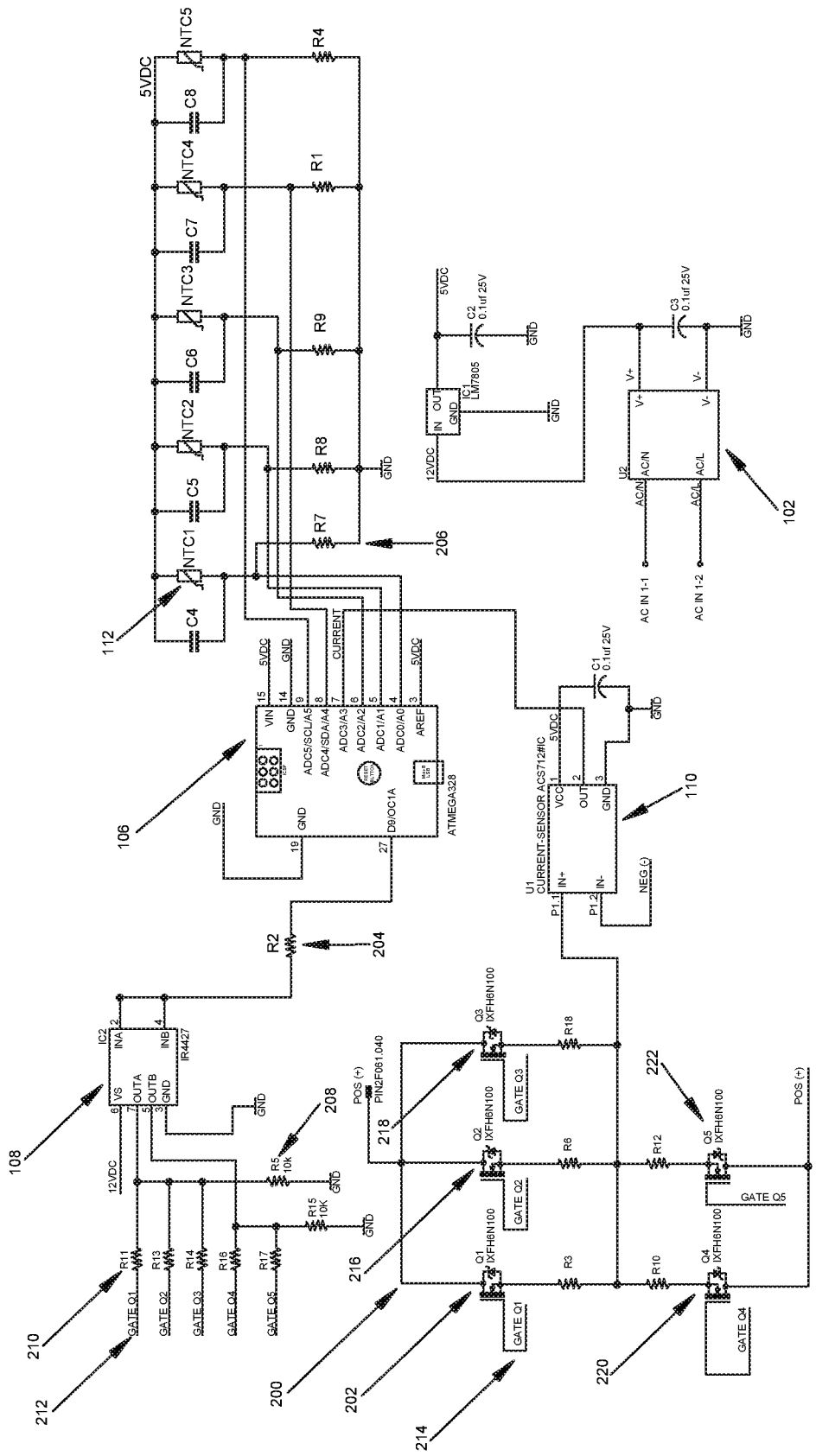
FIG. 2 shows an illustration of a system pin-out and wiring diagram, according to an exemplary embodiment of the invention.
Figure 3:
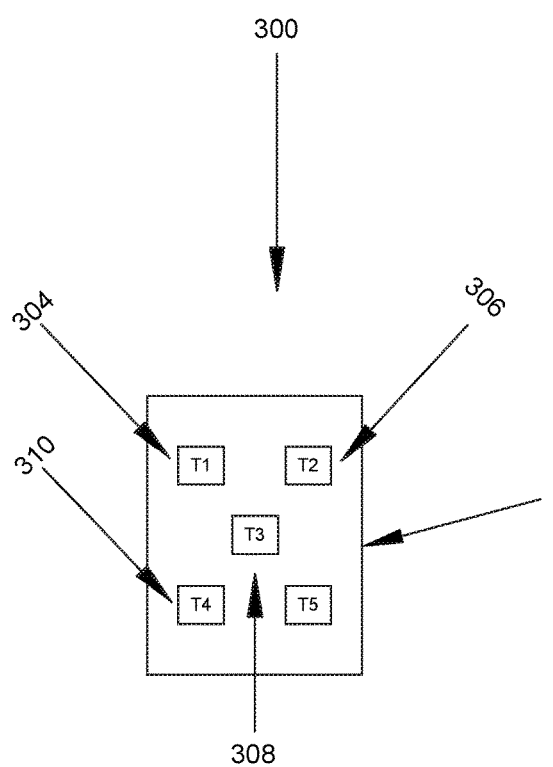
FIG. 3 shows a top view illustration of the system embodiment as a heating component, according to an exemplary embodiment of the invention.
Figure 4:
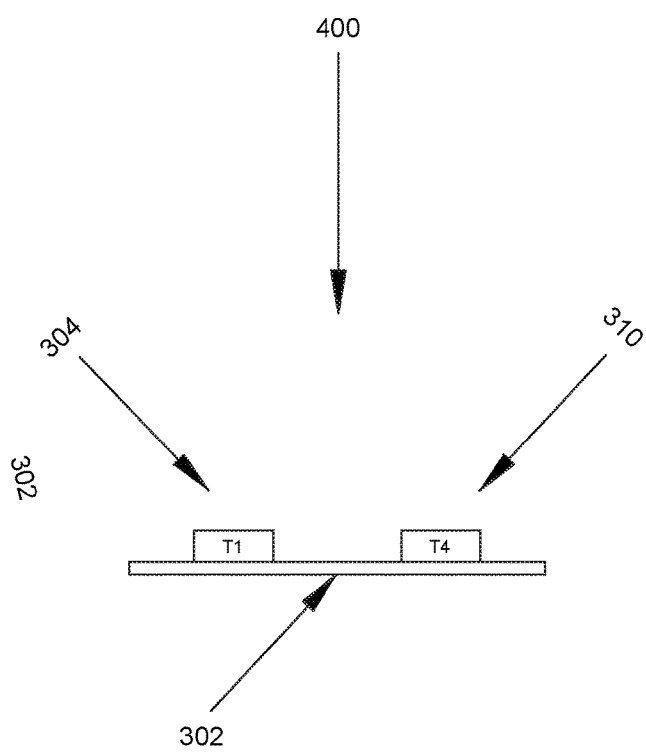
FIG. 4 shows a side view illustration of the system embodiment as a heating component, according to an exemplary embodiment of the invention.

Referring to FIGS. 1 and 2 we see a proposed system block diagram 100, and exemplary schematic 200 which shows the energy source 102, which may be comprised of an AC/DC voltage converter, a battery or capacitor source or any suitable DC source. Said source 102 is connected to a processing component 106 (a Central Processing Unit (CPU), Field Programmable Gate Array (FPGA), Application specific IC (ASIC) or similar unit capable of comparing current sensing components 110 and temperature sensing components 112 and using these to drive a circuit driver 108 in combination with a Duty Cycle generator/work period monitor 114 connected to one or more transistors circuits 104 which generate heat without any separate resistor components generating any sizeable heat component.

In one embodiment 200, the processing component unit 106 is a CPU (such as the Atmel ATMEGA328-MU) which controls the process through the generation of a high-frequency Pulse-Width-Modulator (PWM) signal through its pin 27. The PWM goes across the R2 resistor 204, into the Driver 108 component (such as an Infineon IR4427 or similar part). The PWM signal is derived from a Proportional-Derivative-Integrated (PDI) equation that is proportional to the signals sensed at the temperature sensing component 112 and the current sensing component 110. In one embodiment, the current is sensed using a SHUNT resistor. In an alternate embodiment, a Hall Effect sensor is used (using a component such as the Allegro ACS712 or similar). The current being sensed is that coming out of the transistors Q1-Q5, described below. The temperature being sensed, is that of the heat plate 302.

Based on the calculated PID signal, the PWM signal at pin 27 drives the driver 108 output element with a PWM signal (212 to 214) supplied to the one or more transistors Q1-Q5 (202, 216, 218, 220, 222) acting as the sole direct heating elements (any other heat generated by the resistive and other Integrated Circuit components in the system being ancillary). This is critical, in effect and unlike other references, the output of Q1-Q5 is not driving a resistor that heats up, but directly acting as the heating element. Note that the shown schematic 200 is optimal for controlling one to five transistors, but may be replicated as required within a heating system.

The CPU 106 performs a Proportional-Integrative-Derivative (PID) control loop to ensure the PWM signal allows the current going through the one or more Q transistors (202, 216, 218, 220, 222) reaches the desired temperature without compromising the structural integrity of the Q physical package (and the control is of course is based on the known characteristics of the Q transistor).

In effect, the high frequency PWM signal forces the one or more transistors Q1-Q5 to alternate between a no load/ high load condition. In the high load condition their current output is almost zero, while in the no-load condition, their current output is maximized. This large current (a function of the physical construction of the transistor) generates a large amount of heat directly on the transistor package. The PWM duty cycle alternates the one or more transistors go between a zero resistance load and an infinite resistance load, with the zero resistance being of necessity a brief period. This action results in brief overheating, followed by cooling of the one or more Q package. As noted, a single CPU 106 could control one or more Q heating sources. The various resistors in the circuit, are a function of how many heat-generating transistors Q are desired, not selected for their heat generating capacity.

One embodiment of the heating plate 104 may be that of a heating iron, or a heating plate for an air drier. In one exemplary embodiment, such a system (top view) 300, shows one or more transistor packages 302, 304, 306, 308, 310 whose heat sinks are thermally attached to a plate 302. The side view 400 shows these 304, 310 over the plate 302. Note the transistors may be already packaged (such as the IXYS IXFH6N100 or similar) which is mechanically/ chemically connected to a heat sink, thermal conductive surface or plate 302, and/or be individual direct transistors similarly bonded to the plate 302.

In operation, the system will take energy from a power source, temperature and thermal goal instructions (from one or more devices and/or memory), proceed to calculate the desired temperature, the present temperature (from the sensor 112), the present current (110), and then calculate (based on the control desired, i.e. linear, PWM, PID, etc.) the rate of heating (e.g. a degree per second, etc.) based on the heating transistors 302, 304, 306, 308, 310 and the heat plate 104 characteristics.

The system then proceeds to drive the current on the CPU 106, which drives the driver 108 (through the transistor), in turn driving the one or more heating transistors Q1 302, 304, 306, 308, 310. Once the heat is generated by the transistors (reflecting on the temp. sensor 112), the system proceeds to monitor the current sensor 110 (to ensure against any failures of short circuits), resulting in the system operation.

The current controlled by the one or more Q1 transistors 302, 304, 306, 308, 310, may then be fed back to the energy source, resulting in significant energy savings.

In operation, the CPU 106 receives a desired temperature goal (including factors such as the desired temperature, rate of heating, total energy to be used (hourly/total)). Such data may be preprogrammed, available from memory, and/or one or more user interface. Such an I/F may be accomplished by a programmable switch or knob, as well as by an application running on a separate device (say the User's computer, tablet or Smartphone) either via wired or wireless means (such as Bluetooth, Wi-Fi, etc).

In addition to the desired temperature and/or usage parameters (as defined above), the CPU may also receive the material and other characteristics about the material being heated. This may include, as an example, that the item being laundered be is silk, but mounted on a plastic backing, so that the iron may know to provide significant heat, and to also overcompensate, under compensate and/or be similarly adjusted based on the thermal characteristics of the item.

As shown, the system 200 that has five heat generating transistors Q1-Q5 (202, 902, 904, 906, 908), which may be a part like the IFXH6N100, which are controlled through a PWM signal derived from the measure plate temperature 112 and the transistor short circuit current measurement 110 (a hall effect current sensor), both measurements go into an A/D 8 bit converter (although it may be any number of bits), the temperature going into pin(s) 4-6, 8, 9 and the current going into pin 7. As noted, the short circuit of the one or more transistors Q1-Q5 must be very brief, to prevent the part from overheating and/or burning out. As such, applicant has found that the driver 108 must be capable of fast switching. In practice, much faster in transition than 3 KHz, and preferably above 10 KHz transition from on to off.

In operation, the current and temperature signals are measured as 8 bit signals in order to generate a Pulse-Width-Modulation (PWM) control signal. This may be accomplished through a CPU, FPGA, ASIC or any other suitable software and/or hardware implementation. The temperature 112 signal is digitized into a digital signal, the current is monitored 110 and also similarly digitized. Both are monitored to ensure the setpoints (user/electrical code or otherwise determined) are not exceeded. Once both temperature and current are measured, the PWM is calculated using the following;

FUNCTION(FIRST ARGUMENT (PWM OUTPUT PIN 204), SECOND ARGUMENT (ENSURE PWM VALUE DOES NOT EXCEED SET POINT 112, 110).

Thus, the output of the PWM comes to be a PWM output signal 204 which may be on/off with a duty cycle signal that may be on from zero to 100% of the cycle. In one example, we have found that the PWM is on only 17% of the time (at a maximum), and may be as low as 5% (with the signal being 0 the rest of the time) as each transistor heats in its most efficient fashion. In one embodiment, we find that the PWM signal 210 must be switched at high frequency (preferably at 10 KHz to 30 KHz range), so that the latency in the transistor does not cause a part failure within the Q1-Q5 transistor. In one embodiment, the 8 bit signal generated results in a 0 bit (0 volts) and a 255 bit being 12 volts.

In an alternate embodiment of this, the unit is equipped with an input plug and an output plug. So when a user desires to re-circulate the power to the outlet circuit, they simply plug both and the energy enters the system through one and returns to the system through another or vice versa.

CONCLUSION

In concluding the detailed description, it should be noted that it would be obvious to those skilled in the art that many variations and modifications can be made to the preferred embodiment without substantially departing from the principles of the present invention. Also, such variations and modifications are intended to be included herein within the scope of the present invention as set forth in the appended claims. Further, in the claims hereafter, the structures, materials, acts and equivalents of all means or step-plus function elements are intended to include any structure, materials or acts for performing their cited functions.

It should be emphasized that the above-described embodiments of the present invention, particularly any "preferred embodiments" are merely possible examples of the implementations, merely set forth for a clear understanding of the principles of the invention. Any variations and modifications may be made to the above-described embodiments of the invention without departing substantially from the spirit of the principles of the invention. All such modifications and variations are intended to be included herein within the scope of the disclosure and present invention and protected by the following claims.

The present invention has been described in sufficient detail with a certain degree of particularity. The utilities thereof are appreciated by those skilled in the art. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

The invention claimed is:

1. A high voltage and high heat generating apparatus comprising:
    an electronic circuit comprised of an electronic calculating component, a circuit driver component, a temperature measurement component, a current measurement component and one or more transistors, wherein one or more of said transistors is comprised of a metal oxide field effect transistor with silicon carbide technology;
    wherein said electronic calculating component is capable of interfacing with said temperature measurement and said current measurement components to generate a transistor control signal through said circuit driver component;
    wherein said temperature measuring component is comprised of two or more resistors, with one of them being said at least one transistor's internal resistor which is used as the circuit's load resistance;
    said current measurement component is comprised exclusively of a hall effect sensor;
    said circuit driver component is comprised of an IC driver and one or more resistors;
    said electronic calculating component is comprised of one of; CPU, FPGA and/or ASIC; and
    said transistor control signal is comprised of a Pulse-Width-Modulation (PWM) signal implementing proportional-integral-derivative (PID) control.

2. The heat generating apparatus of claim 1 wherein;
said circuit driver component IC has a bandwidth over 10 KHz.

3. The heat generating apparatus of claim 2 wherein;
said one or more transistors are mechanically coupled to a heat transmitting component.

4. The heat generating apparatus of claim 1 wherein;
said one or more transistors are mechanically coupled to a heat transmitting component.

5. A method for generating heat without external resistors, said method comprising the steps of:
providing an electronic circuit comprised of an electronic calculating component,
a circuit driver, a temperature measurement component, a current measurement component and one or more transistors, wherein one or more of said transistors is comprised of a metal oxide field effect transistor with silicon carbide technology;
wherein said electronic calculating component is capable of interfacing with said temperature measurement and said current measurement components to generate a transistor control signal through said circuit driver wherein said temperature measuring component is comprised of two or more resistors, with one of them being said at least one transistor's internal resistor which is used as the circuit's load resistance;
said current measurement component is comprised exclusively of a hall effect sensor;
said circuit driver component is comprised of an IC driver and one or more resistors;
said electronic calculating component is comprised of one of; CPU, FPGA and/or ASIC; and
said transistor control signal is comprised of a Pulse-Width-Modulation (PWM) signal implementing proportional-integral-derivative (PID) control.

6. The heat generating method of claim 5 wherein;
said circuit driver component IC has a bandwidth over 10 KHz.

7. The heat generating method of claim 6 wherein;
said one or more transistors are mechanically coupled to a heat transmitting component.

8. The heat generating method of claim 5 wherein;
said one or more transistors are mechanically coupled to a heat transmitting component.

\* \* \* \* \*